United States Patent
Edwards

(10) Patent No.: US 10,177,140 B2
(45) Date of Patent: Jan. 8, 2019

(54) BIPOLAR TRANSISTOR INCLUDING LATERAL SUPPRESSION DIODE

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/156,590

(22) Filed: May 17, 2016

(65) Prior Publication Data

US 2016/0260711 A1 Sep. 8, 2016

Related U.S. Application Data

(63) Continuation of application No. 14/531,751, filed on Nov. 3, 2014, now Pat. No. 9,373,615.

(51) Int. Cl.
*H01L 27/102* (2006.01)
*H01L 27/06* (2006.01)
(Continued)

(52) U.S. Cl.
CPC ...... *H01L 27/0664* (2013.01); *H01L 21/8222* (2013.01); *H01L 27/0255* (2013.01);
(Continued)

(58) Field of Classification Search
CPC .............. H01L 21/8222; H01L 21/8248; H01L 21/8249; H01L 27/0229; H01L 27/0255; H01L 27/0259; H01L 27/0274; H01L 27/0277; H01L 27/0623; H01L 27/0635; H01L 27/0647; H01L 27/0652; H01L 27/0658; H01L 27/0664; H01L 27/067; H01L 27/0711; H01L 27/07; H01L 27/0727; H01L 27/0733; H01L 27/0738; H01L 27/075; H01L 27/0755;
(Continued)

(56) References Cited

U.S. PATENT DOCUMENTS 4,639,755 A * 1/1987 Namiki ............... H01L 27/0211 257/470
5,341,005 A * 8/1994 Canclini ............. H01L 27/0248 257/173
(Continued)

*Primary Examiner* — Cuong B Nguyen
*Assistant Examiner* — Samuel Park
(74) *Attorney, Agent, or Firm* — Jacqueline J. Garner; Charles A. Brill; Frank D. Cimino

(57) ABSTRACT

A transistor includes an emitter of a first conductivity type, base of a second conductivity type, collector of the first conductivity type, and cathode of a lateral suppression diode. The emitter is disposed at a top surface of the transistor and configured to receive electrical current from an external source. The base is configured to conduct the electrical current from the collector to the emitter. The base is disposed at the top surface of the transistor and laterally between the emitter and the collector. The collector is configured to attract and collect minority carriers from the base. The cathode of the first conductivity type is surrounded by the base and disposed between the emitter and the collector, and the cathode is configured to suppress a lateral flow of the minority carriers from the base to the collector.

16 Claims, 2 Drawing Sheets

(51) Int. Cl.
*H01L 27/02* (2006.01)
*H01L 21/8222* (2006.01)
*H01L 29/417* (2006.01)
*H01L 29/45* (2006.01)
*H01L 29/06* (2006.01)

(52) U.S. Cl.
CPC ...... *H01L 27/0259* (2013.01); *H01L 29/0649* (2013.01); *H01L 29/41708* (2013.01); *H01L 29/45* (2013.01); *H01L 27/067* (2013.01)

(58) Field of Classification Search
CPC ............. H01L 27/0761; H01L 27/0766; H01L 27/0772; H01L 27/0777; H01L 27/0783; H01L 27/0788; H01L 27/0794; H01L 27/082; H01L 27/0823; H01L 27/0921; H01L 27/102; H01L 27/1022; H01L 27/1023; H01L 27/1024; H01L 27/1025; H01L 27/1026; H01L 29/6603
See application file for complete search history.

(56) References Cited

U.S. PATENT DOCUMENTS

| | | | |
|---|---|---|---|
| 6,348,724 B1 * | 2/2002 | Koomen | H01L 27/0255 257/173 |
| 2006/0044719 A1 * | 3/2006 | Chen | H01L 29/7436 361/56 |

* cited by examiner

BIPOLAR TRANSISTOR INCLUDING LATERAL SUPPRESSION DIODE

CROSS-REFERENCE TO RELATED APPLICATIONS

Under 35 U.S.C. § 120, this continuation application claims priority to and benefits of U.S. patent application Ser. No. 14/531,751 (TI-74834), filed on Nov. 3, 2014, the entirety of which is incorporated herein by reference.

TECHNICAL FIELD

This disclosure is generally directed to integrated circuits. More specifically, this disclosure is directed to an apparatus and method for suppressing lateral bipolar conduction paths.

BACKGROUND

Integrated circuits are vulnerable to damage from an electrostatic discharge (ESD) event. An ESD event can occur when a charged object (e.g., human body, component of machinery, a cell phone) physically contacts an integrated circuit (IC). ESD damage to the IC occurs when the amount of charge exceeds the capacity of the conduction path through the IC. Some IC chips include ESD protection mechanisms to prevent damage caused by an ESD event. The ESD protection mechanism can be located on the IC chip at each input terminal and each output terminal. Some ESD protection mechanisms include a transistor structure to absorb the energy from the ESD event without damaging the other components of the IC chip.

SUMMARY

This disclosure provides an apparatus and method for suppressing lateral bipolar conduction paths.

In a first example, a transistor includes an emitter of a first conductivity type, base of a second conductivity type, collector of the first conductivity type, and cathode of the first conductivity type. The emitter is disposed at a top surface of the transistor and configured to receive electrical current from an external source. The base is configured to conduct the electrical current from the collector to the emitter. The base is disposed at the top surface of the transistor and laterally between the emitter and the collector. The collector is configured to attract and collect minority carriers from the base. The cathode is surrounded by the base and disposed between the emitter and the collector, and the cathode is configured to suppress a lateral flow of the minority carriers from the base to the collector.

In a second example, an integrated circuit (IC) includes a semiconductor substrate, a transistor, and an electrostatic discharge (ESD) device. The transistor includes an emitter of a first conductivity type disposed at a top surface of the IC and configured to receive electrical current from an external source. The transistor includes a base of a second conductivity type configured to conduct the electrical current from collector to the emitter. The base is disposed at the top surface of the IC and laterally between the emitter and the collector. The transistor includes the collector configured to attract and collect minority carriers from the base. The transistor includes a cathode of the first conductivity type surrounded by the base and disposed between the emitter and the collector. The cathode is configured to suppress a lateral flow of the minority carriers from the base to the collector. The ESD device includes a first buried layer of semiconductor material disposed vertically above and in direct physical contact with the substrate. The ESD device includes a second buried layer semiconductor material disposed vertically above and in direct physical contact with the first buried layer. The second buried layer has an opposite doping polarity from the first buried layer and the emitter. The ESD device includes the emitter disposed within a top layer of semiconductor material disposed vertically above the second buried layer.

In a third example, a method includes forming an emitter of a first conductivity type disposed at a top surface of a transistor. The emitter is configured to receive electrical current from an external source. The method includes forming a base of a second conductivity type. The base is configured to conduct the electrical current from a collector of the first conductivity type to the emitter. The base is disposed at the top surface of the transistor and laterally between the emitter and the collector. The collector is configured to attract and collect minority carriers from the base. The method also includes forming a cathode of the first conductivity type. The cathode is surrounded by the base and disposed between the emitter and the collector. The cathode is configured to suppress a lateral flow of the minority carriers from the base to the collector.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
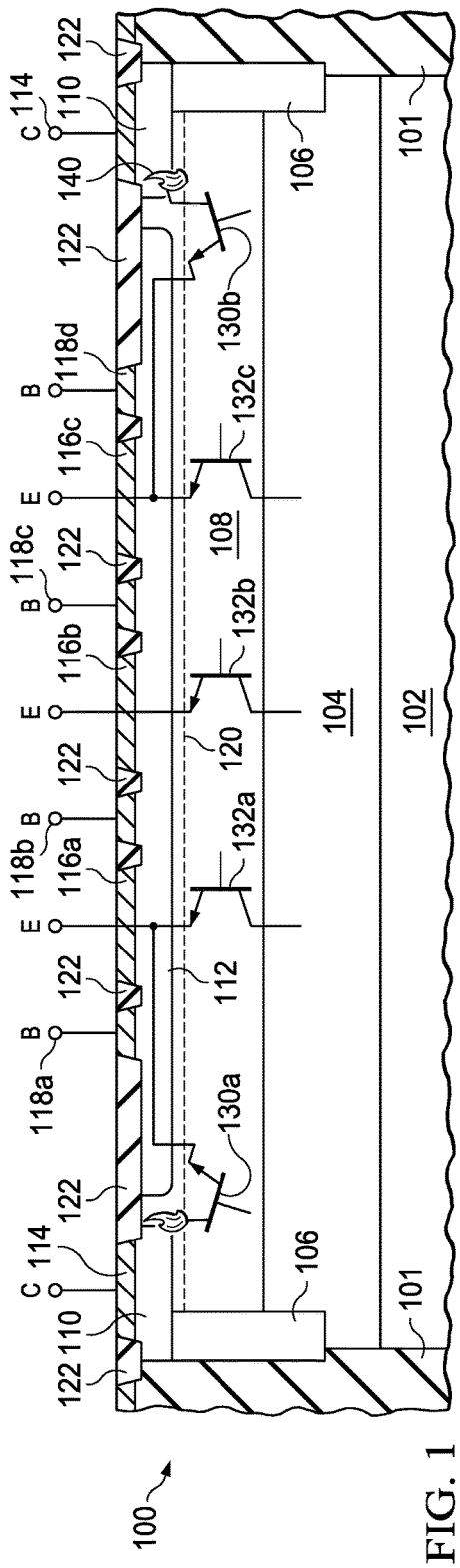
FIG. 1 illustrates a cross-sectional view of an example integrated circuit (IC) device including a vertical transistor according to this disclosure.

FIG. 1 illustrates a cross-sectional view of an example integrated circuit (IC) device including a vertical transistor according to this disclosure. The integrated circuit device 100 shown in FIG. 1 is for illustration only. Other embodiments could be used without departing from the scope of the present disclosure. For example, FIG. 1 is described with reference to the structure of an NPN vertical transistor, but other embodiments can include the structure of a PNP vertical transistor.

In addition to the cross-sectional view of the transistor structure, FIG. 1 shows schematic representations of bipolar sub-transistors that represent the flow of current within the transistor structure. As shown in FIG. 1, the IC 100 includes deep trench (DT) isolators 101, a semiconductor substrate 102 between two of the DT isolators 101, a tank disposed on top of the substrate and between the two DT isolators 101, a deep well p-type epitaxial layer (PEPI) 108 disposed within the tank, two side end shallow wells 110, and a center shallow well 112 grown within the deep well 108. At the top surface, the IC 100 includes a collector 114 disposed on top of each side end shallow well 110, multiple emitters 116a-c (i.e., one emitter per vertical sub-transistor within the IC 100), and a base 118a-d disposed between each collector-emitter pair, and the base is disposed so as to touch the top surface of the IC. Additionally at the top surface, the IC 100 includes inactive field oxide 122 that provides shallow trench isolation between the active regions of active silicon: contact regions of the collector 114, base 118a-d, and emitters 216a-c. In certain embodiments, the field oxide 122 provides shallow trench isolation between transistors.

The IC 100 is formed in and on the semiconductor substrate 102, which can be a silicon wafer, bulk silicon, or active silicon. In the embodiment shown, the substrate 102 has p-type conductivity and includes a first epitaxial layer doped with a p-type dopant and a second epitaxial layer 108 doped with a p-type dopant.

The tank isolates the IC device from the substrate 102. The collector of the NPN vertical transistor is an n-type tank, and accordingly, all of the components of the tank include n-type doped silicon. The cross-sectional view of the tank forms a U-shape. The "bottom" of the tank includes an n-type doped buried layer 104 (NBL). The sides of the tank include a DEEPN diffusion (DEEPN) 106 of n-type doped semiconductor material that extends vertically. More particularly, the NBL 104 is an n-type doped region of semiconductor material implanted before the second epitaxial silicon layer 108 (PEPI) is deposited. DT isolators 101 are formed by etching a trench from the top of the substrate 102 and filling the trench with appropriate materials such as dielectric materials or polysilicon materials. That is, the NBL 104 extends the entire width between the DT isolators 101. The DEEPNs 106 are each implanted vertically alongside the DT isolators 101 and down into the NBL 104. For example, a DEEPN 106 can extend from mid-depth of the NBL 104 to the bottom surface of one of the side end shallow wells 110. In certain embodiments, DEEPN 106 is formed as a phosphorus implant into the silicon surface after the second epitaxial layer 108 (PEPI) is deposited and diffused down through the PEPI 108 to touch the NBL 104 using a furnace anneal.

The deep well 108 is an epitaxial layer grown on top of the NBL 104 and between the DEEPNs 106. The deep well 108 includes a p-type doped semiconductor material that forms a buried layer (PBLMV). The lower portion (PBLMV) (shown below the line 120) of the deep well 108 can carry a medium voltage and the upper portion (PBLLV) (shown above the line 120) of the deep well 108 can carry a lower voltage. In certain embodiments, the PEPI 108 is doped sufficiently to provide junction isolation between a shallow n-type well (SWELL) 110 and the NBL 104 in order to avoid additional p-type buried layer (PBL) type diffusions.

The doping polarity of the side end shallow wells 110 is opposite the doping polarity of the center shallow well 112. That is, the side end shallow wells 110 include n-type doped semiconductor material, and the center shallow well 112 includes p-type doped semiconductor material. The p-type center shallow well 112 is disposed horizontally (i.e., laterally) between the side end shallow wells 110, forming two lateral PN junctions. In FIG. 1, the left side end shallow well 110 and the center shallow well 112 together form an PN junction, and the center shallow well 112 and the right side end shallow well 110 together form a PN junction. The NBL 104 and DEEPN diffusions 106 form the n-type tank of the NPN vertical transistor. The PEPI 108 forms the base of the NPN vertical transistor, and the n-type active regions 116 form the emitter of the NPN vertical transistor.

The IC 100 includes a lateral parasitic sub-transistor (NPN) disposed at each lateral bipolar junction between the side end shallow well 110 and center shallow well 112 (PN junction). More particularly, the PN lateral junction forms the lateral parasitic sub-transistor 130a, and the PN lateral junction forms the lateral parasitic sub-transistor 130b. The lateral PN junctions set the breakdown voltage of the respective lateral parasitic transistors 130a-130b, and accordingly also sets the trigger voltage of the ESD protection mechanism within the IC device 100.

The primary conduction mechanism of the NPN transistor shown in FIG. 1 is the vertical transistor having a vertical n-type p-type n-type (NPN) arrangement configured to deposit carriers in the collector formed by the n-type tank (106 and 104). The current conduction path is thermally robust during an ESD strike because heat from each electron is deposited nearer the bulk silicon substrate 102, from which point the heat can flow more easily from the NPN transistor without disrupting the delicate surface features. That is, the IC 100 includes multiple (for example, three) vertical sub-transistors 132a-c that direct current along a vertical path originating deep below the top surface of the IC 100. Each NPN vertical transistor 132a-c includes an emitter 116a-c located at the top surface of the IC 100, a base located in the deep well 108, and collector located in the NBL 104.

During operation, the emitters 116a-c are connected to ground; the bases 118a-d are connected directly to ground or connected through a resistor to ground; and the collectors 114 are connected to a pin that needs ESD protection. The voltage of the collectors pin is less than the trigger voltage of the ESD NPN transistor depicted in FIG. 1. During an ESD strike, PN junctions begin to undergo impact ionization, which provides current into the base region, causing the emitter-base junction (for example, the junction between the emitter 116a and base 118a) to become forward biased, which causes electron injection into the p-type region. The electrons diffuse through the p-type region of the center shallow well 112 and the deep well 108, and then are collected at a collector. The electrons can travel through either a vertical path or a lateral parasitic path. That is, the electrons can be collected through the vertical path with the proximate junction being the NBL 104. Alternatively, the electrons can be collected through the lateral path with the proximate junction being the side end shallow well 110. The motion of the electrons in the IC 100 can be expressed as a diffusion equation. That is, the diffusion equation mathematically expresses that in a bipolar transistor, diffusion current tends to flow from the emitter through the base in all available directions. The diffusion equation is a "spreading equation," meaning that minority carriers (for example, electrons in the base) extensively spread throughout the IC 100, including downward along the vertical paths of the vertical transistors 132a-c and sideways along the lateral paths of the lateral parasitic transistors 130a-b.

As the pin voltage increases during an ESD strike, prior to the ESD NPN triggering, the silicon begins to deplete, and the field increases, and then the PN junction breaks down. The surface lateral junction is where the breakdown occurs. As a result, the spacing between the center shallow well 112 and the side end shallow well 110 determines or otherwise controls the breakdown voltage of the IC 100. More particularly, a photomask can be used to form a specific spacing between the center shallow well 112 and the side end shallow well 110 to specify the breakdown voltage. During operation, each lateral PN junction 130a, 130b operates similar to an avalanche diode. As soon as the avalanching starts, then the base 118a, 118d receives an injection of some of the avalanching carriers, thereby generating a base current that turns the IC 100 ON. The lateral parasitic transistors 130a-b trigger the ESD NPN transistor shown in FIG. 1 to carry current at a high voltage, such that even during an ESD event, the voltage of the PN junction never falls below the supply voltage. This property of an ESD NPN, namely, preventing the voltage of the PN junction from falling below the supply voltage, allows the ESD NPN to be used as an ESD clamp.

The IC device 100 is an ESD protection device on the chip configured to prevent damage from an ESD event. For example, an ESD event endures for only a very short period of time, such as 100-500 nanoseconds, depending on the type of ESD event. During the ESD event, an input or output terminal of the IC device 100 receives an injection of an electrostatic pulse (referred to as an ESD pulse) of electrical current from an external electrostatically charged object (e.g., human body). An ESD pulse can include approximately 2-3 amperes at one portion of the pulse and additionally includes approximately 18-20 amperes at another portion of the pulse, where the peak amperage portion of the ESD pulse endures for approximately 100-200 nanoseconds.

In order to prevent ESD damage, the ESD protection device turns ON very quickly in response to specific conditions, absorbs most or all of the current of the ESD pulse injected during the ESD event, and transmits the current uniformly throughout the IC device 100. The efficiency and effectiveness of the ESD protection device increases based on how uniformly the ESD protection device distributes the energy absorbed from an ESD pulse to dissipate heat.

Accordingly, the efficiency and effectiveness of the ESD protection device decreases based on inadequate structure for uniformly transmitting high currents that form a hot spot in the IC device 100. An ESD protection device can exhibit poor effectiveness if the current from the ESD pulse filaments into one of the emitters. That is, the collector may explode from suddenly receiving all of the ESD pulse current. An exploded emitter is an example of a failed IC device caused by ESD damage. As another example, an ESD protection device that includes a hot spot exhibits poor effectiveness. A hot spot is a location where an IC device is not thermally robust enough to dissipate the heat resulting from the power the IC device generates. Such an IC device is likely to fail first at a hot spot.

The IC 100 operates as a clamping device such that once the ESD protection device within the IC 100 is triggered to turn ON, the IC 100 maintains operations at a high voltage with high current and does not snap back to operate at a lower voltage once the ESD event ends. For a same amount of received current, the clamping-type IC 100 dissipates a greater amount of power (i.e., power=current×voltage) than the amount of power that a snap-back-type device would generate. As an increase in power generation corresponds to an increase in heat generation, accordingly, a clamping-type device structure requires a higher level of thermal robustness than the structure of a snap-back-type device in order to prevent hot spots and IC device failure.

The weakest point(s) of the IC device 100 include one or more hot spots (such as the hot spot 140 shown in FIG. 1) that limit the operating efficiency. The hot spots of the IC 100 can be located at each breakdown junction between the side end shallow well 110 and the center shallow well 112. For example, the hot spot 140 can form because an undesired lateral bipolar path of current can occur at the same time and location as a desired vertical bipolar path of current. More particularly, electrons and holes that jump across the depletion region of a collector-base junction generate heat by dropping down from the conduction band to the valance band, depositing energy (i.e., $e(V_{collector} - V_{base})$) into the lattice, and emitting phonons. The vertical bipolar path is advantageous because the collector to base junction between the NBL 104 and deep well 108 is located below the top surface of the IC device 100 deep within the semiconductor material, where the IC device 100 dissipates heat in a three dimensional (3D) manner. The lateral bipolar path is undesirable because the breakdown junction between the side end shallow well 110 and the center shallow well 112 is located near the top surface of the IC device 100. The dielectric layers (i.e., shallow wells 110 and 112), located near the top surface of the IC device 100, are significantly less thermally conductive than silicon and do not perform well at transferring heat for dissipation compared to the silicon layers (i.e., NBL 104 and deep well 108) located deep below the top surface of the IC device 100. As a result, the heat generated at the breakdown junction between shallow wells 110 and 112 does not effectively transfer up toward the top surface of the IC device because the upward direction has limited heat dissipation capabilities. As silicon semiconductor material has a high thermal conductivity, the silicon layers perform well at transferring heat for dissipation, and the heat generated at the breakdown junction between shallow wells 110 and 112 transfers downward away from the top surface of the IC device. The lack of heat dissipation in the upward direction from the breakdown junction between shallow wells 110 and 112 forms a non-uniform, non-3D heat dissipation path in the downward direction, which destabilizes the vertical bipolar path and generates each hot spot 140.

Figure 2:
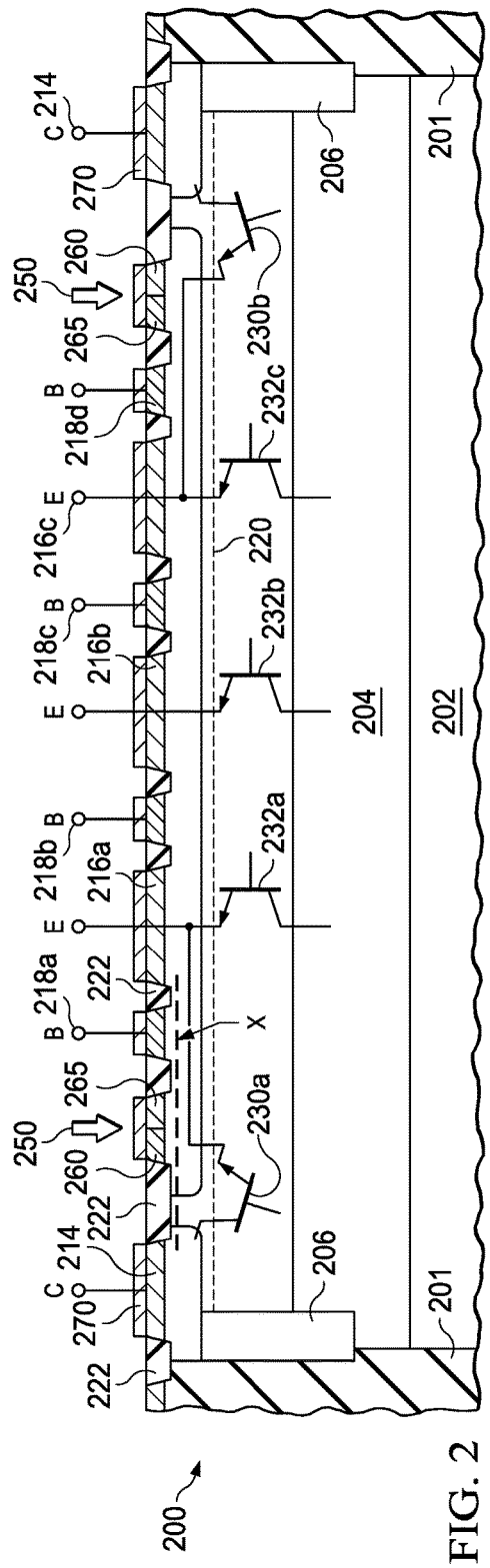
FIG. 2 illustrates a cross-sectional view of an integrated circuit (IC) device including a lateral suppression diode according to this disclosure.

As another example, FIG. 2 illustrates a cross-sectional view of an integrated circuit (IC) device including a lateral suppression diode according to this disclosure. The integrated circuit device 200 shown in FIG. 2 is for illustration only. Other embodiments could be used without departing from the scope of the present disclosure. For example, the embodiments of the present disclosure are described with reference to the structure of an NPN vertical transistor, but other embodiments can include the structure of a PNP vertical transistor. For example, the embodiments of the present disclosure are described with reference to a lateral suppression diode between its p-type contact to the base region and the collector, but other embodiments can include the structure of a lateral suppression diode between its p-type contact to the base region and the emitter. In certain embodiments, the lateral suppression diode is grounded. In certain embodiments, the lateral suppression diode is reverse biased to collect minority carriers, not inject minority carriers.

In addition to the cross-sectional view of the transistor structure, FIG. 2 shows schematic representations of bipolar sub-transistors that represent the flow of current within the transistor structure.

Note that components 202, 204, 206, 208, 210, 112, 214, 216a-c, 218a-d, 220, 222, 230a-b and 232a-c in FIG. 2 could be the same as or similar to corresponding components 102, 104, 106, 108, 110, 112, 114, 116a-c, 118a-d, 120, 122, 130a-b and 132a-c in FIG. 1 These components in FIG. 2 can operate in the same or similar manner as the corresponding components in FIG. 1.

As described above, a diffusion equation can express the motion of the minority carriers (e.g., electrons) in the IC 200. That is, the diffusion equation can mathematically express that in a bipolar transistor, diffusion current tends to flow from the emitter through the base in all available directions (i.e., 3D). However, a transistor designer may intend a specific path for current flow, and may identify any unintended path as parasitic bipolar conduction paths that are not consistent with the intended design of the transistor. For example, in an ESD protection device that includes a vertical NPN transistor, the transistor designer may desire to prevent lateral NPN current flow because the characteristics (for example, holding voltage) of each bipolar path are different. The lateral bipolar paths have worse power handling than vertical paths because lateral paths are nearer the top surface of the IC, and accordingly generate heat near the oxide. Oxide is thermally weaker and less conductive than bulk silicon.

The IC 200 includes one or more lateral suppression diodes (LSD) 250. Each LSD 250 suppresses the current flow along the undesired lateral bipolar path that forms the hot spots 140 at the breakdown junction discussed in reference to FIG. 1. That is, the LSD 250 suppresses the diffusion current. Each LSD 250 includes n-type semiconductor material 260 (also referred to as a cathode) and p-type semiconductor material 265 (also referred to as an anode). The cathode 260 is in direct physical contact with the center shallow well 212. Also, the cathode 260 is in direct physical contact with the anode 265. More particularly, the LSD 250 includes two PN junctions: a lateral PN junction between the cathode 260 and anode 265 and a vertical PN junction between the cathode 260 and the center shallow well 212. In the embodiment shown, the cathode 260 is disposed laterally between the anode 265 and the collector 214. In certain embodiments, the LSD 250 structure is rotated 180° about a vertical axis such that the cathode 260 is disposed laterally between the anode 265 and the base 218d; and the anode 265 is disposed laterally between the cathode 260 and the collector 214.

The LSD 250 provides an extra cathode 260 in the base region of the IC 200, and the cathode 260 is grounded to the base region through silicide at the top surface of the cathode 260. The cathode 260 provides a recombination center, disposed near the top surface of the base, for minority carrier electrons that were laterally injected from the outermost emitters. As described below, the cathode 260 does not absorb a large amount of heat because its reverse bias provides a small potential drop across the base diffusion.

The IC device 200 includes silicide 270 disposed above an indirect contact with the collectors 214, the bases 218a-d, and the emitters 216a-c forming the top surface of the IC 200. The silicide 270 can extend along the entire width of the surface collectors 214, bases 218a-d, and emitters 216a-c. The silicide 270 is used to establish ohmic contacts into the doping. That is, the silicide 270 ohmically couples the cathode 260 to the base and to a positive voltage supply relative to the base voltage. The silicide 270 forms a direction connection between the n-type semiconductor material 260 and all of the p-type material of the regions 265 and 212 surrounding the n-type semiconductor material 260.

In certain embodiments, the material in the n-type semiconductor material 260 is the same material as in the collectors 214 and emitters 216a-c, and the material in the anode 265 is the same material as in the bases 218a-d.

During operation, a minority carrier electron diffusing through p-type silicon (e.g., the center shallow well 212, the deep well 208, or the anode 265) can fall into the depletion region of the PN junction of the LSD 250. The LSD 250 provides a zero-point (i.e., sink of carriers) in the minority carrier electron distribution, which prevents minority carriers from reaching the side end shallow well 210.

The LSD 250 provides technical advantages including: a low heat method for preventing minority carrier electrons from reaching the side end shallow well 210; and a low cost structure that avoids increased material costs associated with increased concentration of doping of the base 218a-c. More particularly, the side end shallow well 210 maintains a high voltage during operation. As a result, an electron that falls into the PN junction between the side end shallow well 210 and the deep well 208 will release a large amount of energy and thereby generate a large amount of heat into the IC 200 at that junction. In comparison, the LSD 250 maintains a low or zero voltage during operation. As a result, an electron that falls into the PN junction between the cathode 260 and the deep well 208 will release a small amount of energy and thereby emit a small amount of heat into the IC 200 at that junction. That is, the LSD 250 prevents the hot spot 140 from forming in the IC 200 by reducing the amount of heat that a minority carrier electron diffusing through p-type silicon (e.g., the center shallow well 212, the deep well 208, or the anode 265) emits in depletion region of the PN junction of the LSD 250.

In FIG. 2, a line 'X' extends from the emitter 216a to the collector 214. More particularly, the line 'X' extends from the edge of the emitter 216a closest to the base 218a to the edge of the collector 214 closest to the base 218a.

Figure 3:
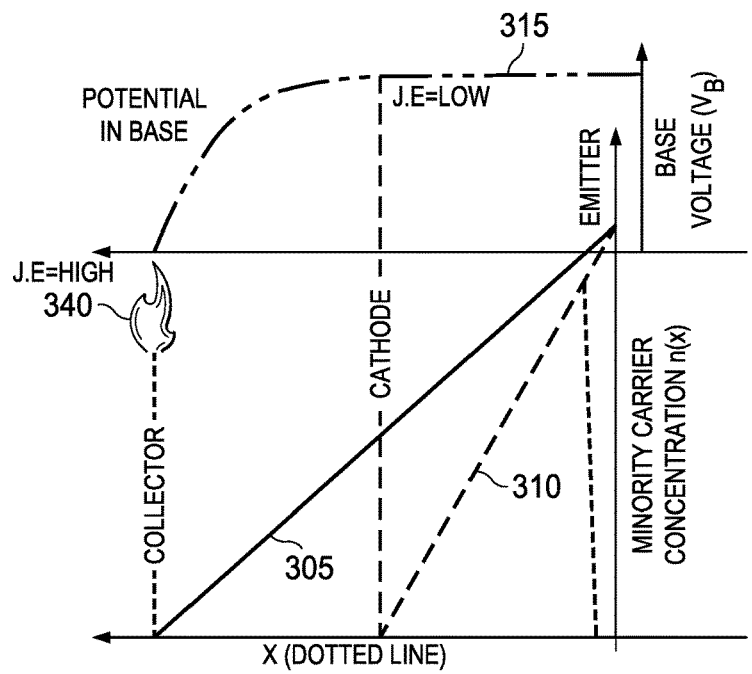
FIG. 3 illustrates a graphical representation of minority carrier concentration as a function of position along the line 'X' of FIG. 2 from the emitter to the collector according to this disclosure.

FIG. 3 illustrates a graphical representation of minority carrier concentration as a function of position along the line 'X' of FIG. 2 from the emitter to the collector according to this disclosure. In FIG. 3, the graphical representations of minority carrier concentration based on position along the line 'X' are the same. FIG. 3A additionally illustrates the electrical potential (i.e., voltage) in the base region based on position along the line 'X' of FIG. 2.

As shown in FIG. 3, the horizontal axis represents position along the line 'X' of FIG. 2. Two vertical axes are shown. The vertical axis extending up from the lower origin represents the minority carrier electron concentration (e.g., shown as a function n(X) of position along the line 'X'). The vertical axis extending up from the upper origin represents the voltage in the base 218a or p-type region (e.g., the center shallow well 212, the deep well 208, or the anode 265).

Line 305 shows that the minority carrier concentration of the IC 100 is highest at the emitter 116a, as the IC 100 receives an injection of electrons into the emitter 116a. Line 305 shows the minority carrier electrons in the p-type region diffuse in a linear manner across the distance from the emitter 116a to the collector 114 and to the side end shallow well 110. The minority carrier concentration at the collector 114 is a negligible value or zero concentration.

Line 315 shows the voltage in the base 118a, 218a as a function of position along the line 'X'. At the position of the emitter 116a, 216a, the electrical potential energy of the minority carrier electrons in the p-type region is high. At the position of the collector 114, 214, the electrical potential energy of the minority carrier electrons in the p-type region is zero or negligible.

Line 310 shows that the minority carrier concentration of the IC 200 is highest at the emitter 216a, as the IC 200 receives an injection of electrons into the emitter 216a. Line 310 shows the minority carrier electrons in the p-type region diffuse in a linear manner across the distance from the emitter 116a to the cathode 260 of the LSD 250. The minority carrier concentration at the cathode 260 is a negligible value or zero concentration.

The line 315 shows that in the IC 100, the minority carrier electrons in the p-type region are attracted to the collector 114 and side end shallow well 110, where the electrons fall into the depletion region of the collector base junction and thereby emit heat forming the hot spot 140. Near the position of the collector 114, 214, the collector-base junction potential difference is high, such that the base potential energy (i.e., line 315) avalanches down to zero causing the electrons to emit a large amount of heat 340. At the cathode position, the potential difference of the vertical bipolar junction between the bottom surface of the cathode 260 and the center shallow well 212 is very small, such that the electrons emit a small amount of heat when the electrons drop down from the conduction band to the valance band, depositing energy into the lattice.

Figure 4:
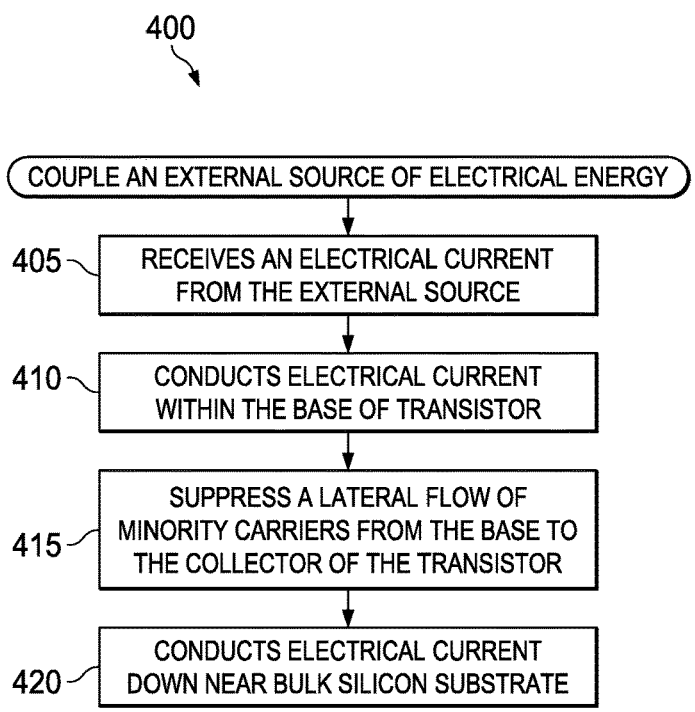
FIG. 4 illustrates a method of suppressing lateral diffusion current within a bipolar transistor according to this disclosure.

FIG. 4 illustrates a method of suppressing lateral diffusion current within a bipolar transistor according to embodiments of this disclosure. The embodiment of the method 400 shown in FIG. 4 is for illustration only. Other embodiments could be used without departing from the scope of this disclosure. A lateral transistor (e.g., emitter 216a, base 218a, LSD 250, and collector 214) within the IC 200 can perform the method 400. However, the method 400 can be performed by any other suitable device in any other suitable system.

In block 405, the transistor receives an electrical current from an external source (for example, a charged object). The electrical current can include an ESD pulse. For example, a charged human hand may touch the IC 200 and transfer electrons into the emitter 216a-c, causing an ESD event.

In block 410, the transistor conducts electrical current within the base 218a-d. For example, in response to receiving the electrons transferred to the emitter 216a, the emitter 216a injects electrons into the base 218a. That is, electrons from the emitter 216a flow into the center shallow well 212 then into the base 218a. When the base 218a includes a p-type doped semiconductor material, the injected electrons are minority carriers in the base and the center shallow well 212. When the base includes a n-type doped semiconductor material, the injected holes are minority carriers in the base.

In block 415, the transistor prevents the electrical current from conducting between the cathode 260 and the collector 214. That is, the transistor suppresses a lateral flow of minority carriers from the base 218a to the collector 214 of the transistor. As the collector 214 is configured to attract and collect minority carriers from the base 218a, the electrons in the base 218a flow laterally from the base 218a toward the collector 214 through the center shallow well 212. Additionally, the cathode 260 within the LSD 250, formed from the same semiconductor material as the collector 214, also attracts the minority carriers from the base 218a to the cathode 260, which is in the same direction of the collector. The lateral flow of minority carriers reaches the vertical bipolar junction between the center shallow well 212 and the cathode 260 before reaching the collector 214, which is disposed a further distance away from the emitter 218a. Accordingly, the cathode 260 collects the minority carriers from the base 218a at the PN junction, thereby suppressing minority carriers from further flowing laterally between the cathode 260 and collector 214.

In block 420, a vertical transistor 132a-c of the IC 200 conducts the electrical current down near the bulk silicon substrate 102. For example, in block 410, a majority portion of the electrons from the emitter 216a flow into the center shallow well 212. The buried layer 204, including the collectors of the vertical transistors 242a-c, attracts the minority carriers to flow from the center shallow well 212 down through the deep well 208 toward the buried layer 204. Then, the buried layer 204 collects the minority carriers that flow down from the deep well 208.

Although FIG. 4 illustrates one example of a method 400 of suppressing lateral diffusion current within a bipolar transistor, various changes may be made to FIG. 4. For example, while shown as a series of steps, various steps in FIG. 4 may overlap, occur in parallel, occur in a different order, or occur multiple times.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transistor cell, comprising:
    a collector tank structure;
    a collector region coupled to the collector tank structure;
    a base layer positioned within the collector tank structure;
    a base region coupled to the base layer;
    an emitter region positioned above the base layer and laterally surrounded by the base region;
    a diode positioned on a top surface of the base layer and between the collector region and the base region, and separated from the emitter region by the base region, wherein the diode includes:
        a cathode facing the collector region; and
        an anode laterally adjacent to the cathode and facing the base region; and
    an oxide isolation structure having a first side abutting the collector region, and a second side abutting the cathode.

2. The transistor cell of claim 1, wherein the diode is laterally isolated from the base region and the collector region.

3. The transistor cell of claim 1, wherein the diode includes:
a cathode;
an anode laterally adjacent to the cathode; and
a silicide layer positioned above the base layer, the silicide layer contacting the cathode and anode.

4. The transistor cell of claim 1, wherein the cathode is coupled to the base region.

5. The transistor cell of claim 1, wherein the collector tank structure includes:
a buried layer under the base layer; and
a vertical diffusion region reaching the buried layer and laterally surrounding the base layer.

6. The transistor cell of claim 1, wherein:
the base region includes a first base region, a second base region, and a third base region spaced apart from each other; and
the emitter region includes a first emitter region interposed between the first and second base regions, and a second emitter region interposed between the second and third base regions.

7. A transistor cell, comprising:
a collector tank structure;
a collector region coupled to the collector tank structure;
a base layer positioned within the collector tank structure;
a base region coupled to the base layer;
an emitter region positioned above the base layer and laterally surrounded by the base region;
a diode positioned on a top surface of the base layer and between the collector region and the base region, and separated from the emitter region by the base region, wherein the diode includes:
a cathode facing the collector region; and
an anode laterally adjacent to the cathode and facing the base region; and
an isolation structure having a first side abutting the base region, and a second side abutting the anode.

8. A transistor cell, comprising:
a collector tank structure;
a collector region coupled to the collector tank structure;
a base layer positioned within the collector tank structure;
a base region coupled to the base layer;
an emitter region positioned above the base layer and laterally surrounded by the base region;
a diode positioned on a top surface of the base layer and between the collector region and the base region, and separated from the emitter region by the base region, wherein the diode includes:
a cathode facing the collector region; and
an anode laterally adjacent to the cathode and facing the base region; wherein:
the cathode is coupled to a first electrode configured to receive a first voltage;
the base region is coupled to a second electrode configured to receive a second voltage lower than the first voltage; and
the collector region is coupled to a third electrode configured to receive a third voltage higher than the first voltage.

9. An electrostatic discharge (ESD) device, comprising:
a vertical bipolar transistor cell, including:
a collector tank structure;
a collector region coupled to the collector tank structure;
a base layer positioned within the collector tank structure;
a base region coupled to the base layer;
an emitter region positioned above the base layer and laterally surrounded by the base region; and
a diode positioned on a top surface of the base layer, the diode laterally isolated from and positioned between the collector region and the base region, and separated from the emitter region by the base region, wherein the diode includes:
a cathode facing the collector region;
an anode laterally adjacent to the cathode and facing the base region; and
an oxide isolation structure having a first side abutting the collector region, and a second side abutting the cathode.

10. The ESD device of claim 9, wherein the diode includes:
an additional oxide isolation structure having a first side abutting the base region, and a second side abutting the anode.

11. The ESD device of claim 9, wherein the collector tank structure includes:
a buried layer under the base layer; and
a vertical diffusion region reaching the buried layer and laterally surrounding the base layer.

12. The ESD device of claim 9, wherein:
the base region includes a first base region, a second base region, and a third base region spaced apart from each other; and
the emitter region includes a first emitter region interposed between the first and second base regions, and a second emitter region interposed between the second and third base regions.

13. An integrated circuit, comprising:
an I/O terminal;
a circuit; and
an electrostatic discharge (ESD) transistor coupled between the I/O terminal and the circuit, the ESD transistor including:
a collector tank structure;
a collector region coupled to the collector tank structure;
a base layer positioned within the collector tank structure;
a base region coupled to the base layer;
an emitter region positioned above the base layer and laterally surrounded by the base region; and
a diode positioned on a top surface of the base layer, the diode laterally isolated from and positioned between the collector region and the base region, and separated from the emitter region by the base region, wherein the diode includes:
a cathode facing the collector region;
an anode laterally adjacent to the cathode and facing the base region; and
an oxide isolation structure having a first side abutting the collector region, and a second side abutting the cathode.

14. The integrated circuit of claim 13, wherein the diode includes:
an additional oxide isolation structure having a first side abutting the base region, and a second side abutting the anode.

15. The integrated circuit of claim 13, wherein the collector tank structure includes:
a buried layer under the base layer; and
a vertical diffusion region reaching the buried layer and laterally surrounding the base layer.

16. The integrated circuit of claim 13, wherein:
the base region includes a first base region, a second base region, and a third base region spaced apart from each other; and
the emitter region includes a first emitter region interposed between the first and second base regions, and a second emitter region interposed between the second and third base regions.

\* \* \* \* \*